United States Patent
Oh et al.

(10) Patent No.: US 9,859,682 B2
(45) Date of Patent: Jan. 2, 2018

(54) LUMINESCENT DIODE, METHOD FOR MANUFACTURING THE LUMINESCENT DIODE AND WAVELENGTH TUNABLE EXTERNAL CAVITY LASER USING THE LUMINESCENT DIODE

(71) Applicant: ELECTRONICS AND TELECOMMUNICATIONS RESEARCH INSTITUTE, Daejeon (KR)

(72) Inventors: Su Hwan Oh, Daejeon (KR); Min Su Kim, Daejeon (KR)

(73) Assignee: ELECTRONICS AND TELECOMMUNICATIONS RESEARCH INSTITUTE, Daejeon (KR)

(*) Notice: Subject to any disclaimer, the term of this patent is extended or adjusted under 35 U.S.C. 154(b) by 0 days.

(21) Appl. No.: 15/159,853

(22) Filed: May 20, 2016

(65) Prior Publication Data

US 2017/0047710 A1 Feb. 16, 2017

(30) Foreign Application Priority Data

Aug. 11, 2015 (KR) .................. 10-2015-0113293

(51) Int. Cl.
*H01S 5/14* (2006.01)
*H01S 5/10* (2006.01)
*H01L 33/00* (2010.01)
*H01L 33/24* (2010.01)
*H01S 5/22* (2006.01)
(Continued)

(52) U.S. Cl.
CPC ........ *H01S 5/1014* (2013.01); *H01L 33/0045* (2013.01); *H01S 5/1064* (2013.01); *H01L 33/24* (2013.01); *H01S 5/026* (2013.01); *H01S 5/101* (2013.01); *H01S 5/141* (2013.01); *H01S 5/22* (2013.01); *H01S 5/227* (2013.01); (Continued)

(58) Field of Classification Search
CPC ........ H01S 5/141; H01S 5/026; H01S 5/1014; H01S 5/223
See application file for complete search history.

(56) References Cited

U.S. PATENT DOCUMENTS 6,256,330 B1 * 7/2001 LaComb ............... H01S 5/20
372/45.01
6,593,162 B1 7/2003 Park et al.
(Continued)

FOREIGN PATENT DOCUMENTS

KR  10-1998-0058399 A  10/1998

OTHER PUBLICATIONS

Su Hwan Oh et al., "Superluminescent Diode With Circular Beam Shape", IEEE Photonics Technology Letters, vol. 25, No. 23, pp. 2289-2292, Dec. 1, 2013.

*Primary Examiner* — Michael Carter
(74) *Attorney, Agent, or Firm* — Rabin & Berdo, P.C.

(57) ABSTRACT

In a luminescent diode and a method for manufacturing the same, a planar buried heterostructure (PBH) and a ridge waveguide structure are combined, so that the luminescent diode can be operated to generate a high output of 100 mW or more at low current. Further, it is possible to reduce electro-optic loss. In addition, the luminescent diode is applied to a wavelength tunable external cavity laser, so that it is possible to provide an external cavity laser having excellent output characteristics.

20 Claims, 11 Drawing Sheets

(51) Int. Cl.
    *H01S 5/026*  (2006.01)
    *H01S 5/227*  (2006.01)

(52) U.S. Cl.
    CPC ....... *H01S 5/2222* (2013.01); *H01S 2301/176* (2013.01); *H01S 2301/18* (2013.01)

(56) References Cited

U.S. PATENT DOCUMENTS

| | | | |
|---|---|---|---|
| 2002/0114368 A1* | 8/2002 | Cho | H01S 5/06203 372/46.01 |
| 2004/0161009 A1* | 8/2004 | Edamura | B82Y 20/00 372/45.01 |
| 2008/0137180 A1* | 6/2008 | Oh | G02B 6/1228 359/344 |
| 2009/0154514 A1 | 6/2009 | Oh et al. | |
| 2010/0014545 A1* | 1/2010 | Lee | G02B 6/0219 372/20 |
| 2012/0307857 A1* | 12/2012 | Oh | H01L 33/0045 372/46.01 |
| 2013/0287054 A1 | 10/2013 | Kwon et al. | |

* cited by examiner

LUMINESCENT DIODE, METHOD FOR MANUFACTURING THE LUMINESCENT DIODE AND WAVELENGTH TUNABLE EXTERNAL CAVITY LASER USING THE LUMINESCENT DIODE

CROSS-REFERENCE TO RELATED APPLICATION

The present application claims priority to Korean patent application number 10-2015-0113293 filed on Aug. 11, 2015 the entire disclosure of which is incorporated herein in its entirety by reference.

BACKGROUND

1. Field

An aspect of the present disclosure relates to a luminescent diode, a method for manufacturing the luminescent diode, and a wavelength tunable external cavity laser using the luminescent diode. More particularly, an aspect of the present disclosure relates to a superluminescent diode (SLD) operated to generate a high output by minimizing electro-optic loss, a method for manufacturing the SLD, and a wavelength tunable external cavity laser using the SLD.

2. Description of the Related Art

A superluminescent diode (SLD) is a light source having an intermediate characteristic of a light emitting diode (LED) and a laser diode (LD), and has recently come into the spotlight as a light source of an optical sensor. Such SLDs are widely used as light sources for fiber-optic gyroscopes that are used as navigation systems in vehicles, ships, airplanes, etc., optical coherence tomography that is a technique for examining, with high resolution, multiple faces of microstructures in living tissues, and wavelength division multiplexing-passive optical networks (WDM-PONs).

Meanwhile, the structure of luminescent diodes generally applied to high-output lasers operated to generate 100 mW or more includes a ridge waveguide (RWG) structure. In the RWG structure, the width of an active layer is wide, and hence a high output can be generated even at high injection current. Thus, the RWG structure is used in SLDs operated to generate a few hundreds of mW or more.

In the case of a planar buried heterostructure (PBH), the PBH has little electro-optic loss but has a narrow width of the active layer, as compared with the RWG structure. Therefore, the PBH is used for a high output, which is very limited.

SUMMARY

Embodiments provide a superluminescent diode (SLD) which can be operated to generate a high output at low current and have little electro-optic loss by combining a ridge waveguide structure and a planar buried heterostructure (PBH), and a method for manufacturing the SLD.

Embodiments provide a wavelength tunable external cavity laser which can be operated to generate a high output using the SLD.

According to an aspect of the present disclosure, there is provided a method for manufacturing a luminescent diode having an active region and a tapered region, the method including: forming an epitaxial layer by sequentially stacking, on a substrate, an n-type passive waveguide, an n-type clad layer, an active layer, and a p-type cap layer; etching a portion of the active layer disposed in the active region within the epitaxial layer, and forming a tapered active layer having a tapered shape along the length direction of the active layer disposed in the tapered region, the tapered active layer extending from the active layer; forming a planar buried heterostructure (PBH) by forming a pnp current blocking layer burying a tapered layer in the tapered region; and forming a ridge waveguide on the active layer in the active layer in the taper region.

The forming of the tapered active layer may include forming the width of the tapered layer to become narrower as it becomes more distant from the active region.

The forming of the tapered active layer may include etching the n-type passive waveguide in a region except the active layer.

The forming of the PBH may include: forming a passive waveguide core by etching the n-type passive waveguide under the tapered layer in the tapered region, wherein the passive waveguide core covers the width of the tapered layer and overlaps with the tapered layer; and forming the pnp current blocking layer burying the active layer and the tapered layer in the active region and the tapered region.

The forming of the pnp current blocking layer may include forming a top surface of the pnp current block layer in the active region to be flat with respect to that of the active layer. A top surface of the pnp current blocking layer in the tapered region may be formed to be inclined at a predetermined angle with respect to that of the tapered surface.

The forming of the ridge waveguide may include: sequentially stacking an etch stop layer, a p-type clad layer, and a p-type ohmic layer over a front facet of the epitaxial layer on which the pnp current blocking layer is formed; forming the ridge waveguide overlapping with the active layer and the tapered layer by selectively etching the p-type clad layer and the p-type ohmic layer; and forming a p-type metal layer over the ridge waveguide and forming an n-type metal layer under the substrate including the epitaxial layer.

The forming of the ridge waveguide overlapping with the active layer and the tapered layer by selectively etching the p-type clad layer and the p-type ohmic layer may include forming the ridge waveguide in the active region to have a reverse mesa structure in which the width of its section is narrowed as it comes close to its lower portion from its upper portion, and forming the ridge waveguide in the tapered region to have a forward mesa structure in which the width of its section is the same from its upper portion to its lower portion.

The forming of the ridge waveguide overlapping with the active layer and the tapered layer by selectively etching the p-type clad layer and the p-type ohmic layer may include forming the ridge waveguide such that the width of ridge waveguide in the active region is narrower than that of the ridge waveguide in the tapered region, the width of ridge waveguide is narrower than that of the active layer in the active region, and the width of ridge waveguide is wider than that of the tapered layer in the tapered region.

According to an aspect of the present disclosure, there is provided a luminescent diode having an active region and a tapered region, the luminescent diode including: a substrate; an active layer formed to have a predetermined width and a predetermined length in the active region on the substrate; a tapered layer having a tapered shape along the length direction of the active layer disposed in the tapered region on the substrate, the tapered active layer formed of the same material as the active layer to extend from the active layer; a pnp current blocking layer formed over the substrate, the pnp current blocking layer forming a PBH by burying the tapered layer; and a ridge waveguide formed on the active layer, the tapered layer, and the pnp current blocking layer, the ridge waveguide being formed to overlap with the active layer and the tapered layer.

The tapered layer may be formed to be inclined at an angle of 5 to 15 degrees with respect to the length direction of the active layer.

The tapered layer may be formed to become narrower as it becomes more distant from the active region.

The luminescent diode may further include a passive waveguide core formed between the tapered layer and the substrate, the passive waveguide core overlapping with the tapered layer while covering the width of the tapered layer.

The pnp current blocking layer may be formed to burry not only the tapered layer but also the active layer, and may be formed to be flat with respect to a top surface of the active layer in the active region. The pnp current blocking layer may be formed to be inclined at a predetermined angle with respect to a top surface of the tapered layer in the tapered region.

The ridge waveguide may be formed in the active region to have a reverse mesa structure in which the width of its section is narrowed as it comes close to its lower portion from its upper portion, and may be formed in the tapered region to have a forward mesa structure in which the width of its section is the same from its upper portion to its lower portion.

The ridge waveguide may be formed such that the width of ridge waveguide in the active region is narrower than that of the ridge waveguide in the tapered region, the width of ridge waveguide is narrower than that of the active layer in the active region, and the width of ridge waveguide is wider than that of the tapered layer in the tapered region.

The luminescent diode may be a superluminescent diode (SLD).

According to an aspect of the present disclosure, there is provided a wavelength tunable external cavity laser including: the luminescent diode; and a reflector disposed adjacent to an output stage of the luminescent diode, at which an end of the tapered layer is disposed, to generate a laser beam by oscillating light emitted from the output stage of the luminescent diode, wherein the reflector includes a first optical waveguide that receives the light emitted from the output stage of the luminescent diode, a second optical waveguide that oscillates the light transmitted from the first optical waveguide, and a third optical waveguide that emits, to the outside, the light oscillated by the second optical waveguide.

The luminescent diode may further include a reflective coating part disposed at an input stage of the luminescent diode, at which an end of the active layer of the luminescent diode is disposed, to reflect light generated from the active layer to be emitted to the output stage of the luminescent diode.

The first optical waveguide of the reflector may be formed to be inclined at an angle of 15 to 25 degrees with respect to a surface of the reflector, disposed adjacent to the output stage of the luminescent diode, to correspond to the emission direction of the light emitted from the output stage of the luminescent diode.

The wavelength tunable external cavity laser may further include a lens disposed between the output stage of the luminescent diode and the reflector to improve the coupling efficiency between the luminescent diode and the reflector.

In general, a light output and an FFP are shown as a circle of 15 degrees or less so as to improve the coupling efficiency of a luminescent diode with an external passive device, etc. From this viewpoint, the luminescent diode according to the present disclosure is provided with a spot size converter (SSC) at the output stage, and the SSC has a structure tilted at an angle of 5 to 15 degrees so as to prevent oscillation of the luminescent diode (i.e., the formation of the tapered layer). Meanwhile, when the ridge waveguide is formed over the tapered layer and the active layer so as to manufacture the luminescent diode having high-output characteristics, the ridge waveguide has a tilted structure, and therefore, electro-optic loss is increased. In order to prevent such a problem, in the luminescent diode according to the present disclosure, the PBH is formed in the tilted tapered region (i.e., the formation of the pnp current blocking layer in the tapered region). Consequently, in the luminescent diode and the wavelength tunable external cavity laser using the same according to the present disclosure, the PBH and the structure of the ridge waveguide are combined in the luminescent diode, so that the luminescent diode can be operated to generate a high output of 100 mW or more at low current. Further, it is possible to reduce electro-optic loss.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

Hereinafter, the present disclosure will be described more fully with reference to the accompanying drawings, in which exemplary embodiments of the disclosure are shown. As those skilled in the art will realize, the described embodiments may be modified in various different ways, all without departing from the spirit or scope of the present disclosure. In describing the present disclosure, parts that are not related to the description will be omitted. Like reference numerals designate like elements throughout the specification.

In addition, when an element is referred to as "including" a component, this indicates that the element may further include another component instead of excluding another component unless there is different disclosure.

The present disclosure is derived from the research conducted as a part of "10 Gbps wavelength tunable optical transceiver for five-generation wired/wireless integrated network and development of operation SW."

Hereinafter, a structure of a luminescent diode 100 according to an embodiment of the present disclosure will be described in detail with reference to FIGS. 1A and 1B. The luminescent diode 100 according to the embodiment of the present disclosure may be a superluminescent diode (SLD).

Figure 1A:
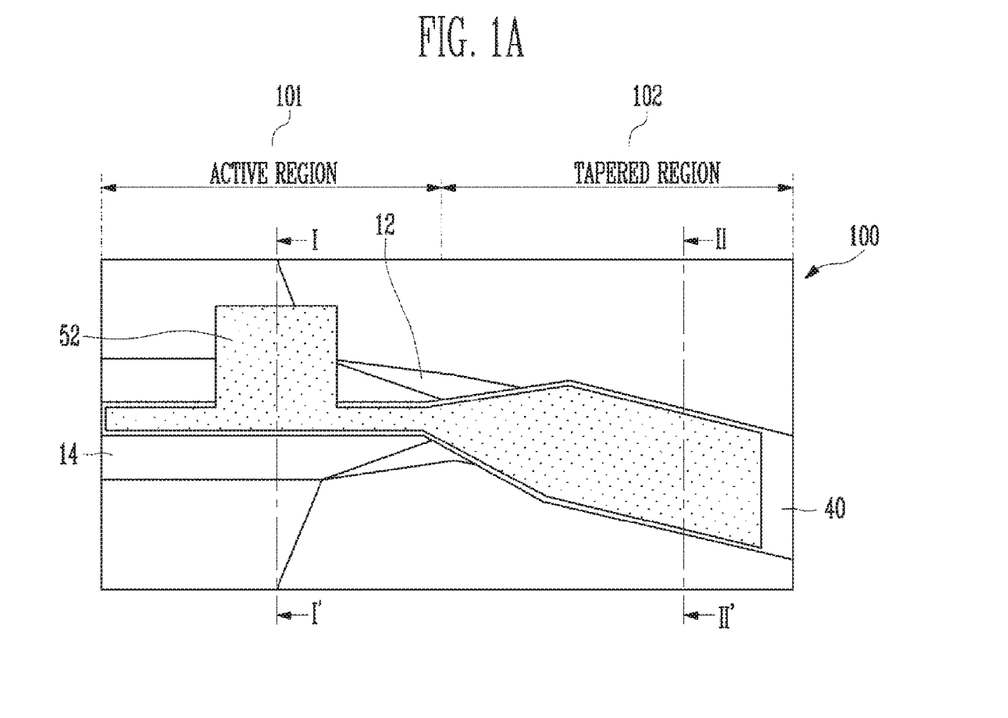
FIG. 1A is a plan view of a luminescent diode according to an embodiment of the present disclosure.

Referring to FIG. 1A, the luminescent diode 100 according to the embodiment of the present disclosure may be divided into an active region 101 and a tapered region 102 on a front facet thereof. With respect to a dotted line of FIG. 1A, a left side region is the active region 101 and a right side region is the tapered region 102.

Figure 1B:
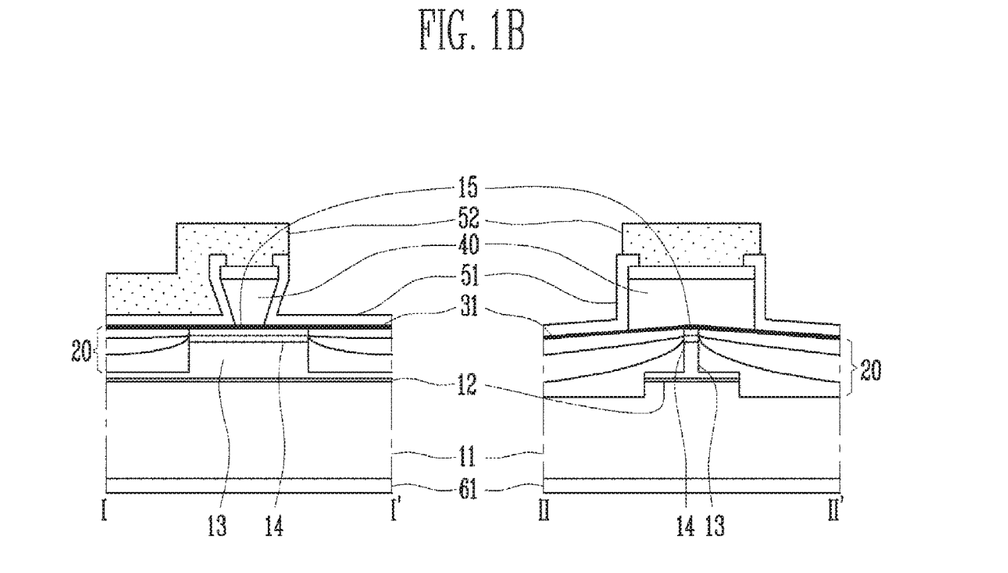
FIG. 1B is a sectional view in an active region and a tapered region of the luminescent diode according to the embodiment of the present disclosure, which shows sectional views of regions I-I' and II-II' of FIG. 1A.
Figure 2:
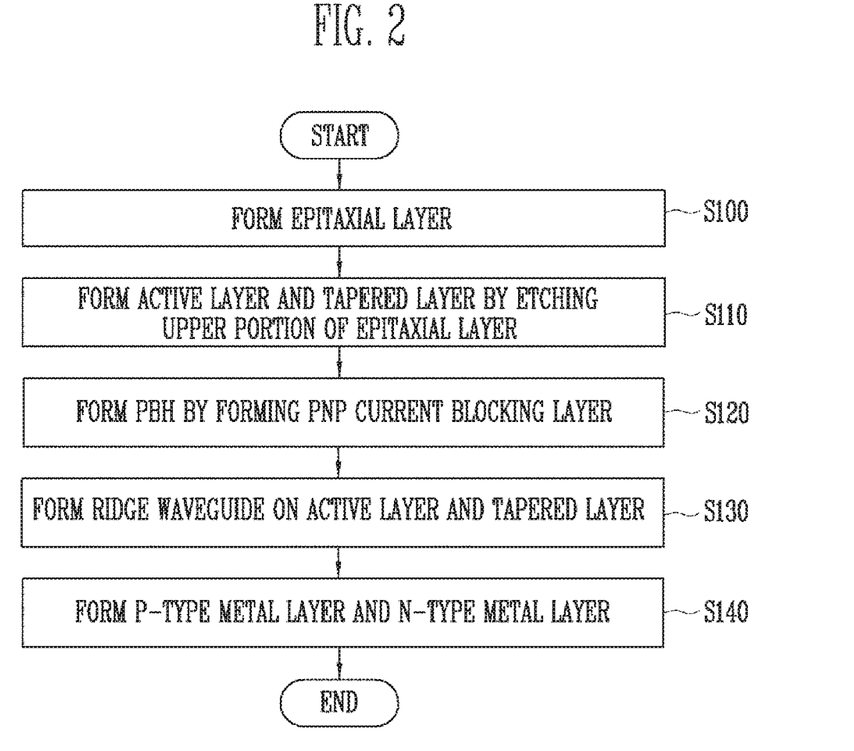
FIG. 2 is a flowchart illustrating a method for manufacturing the luminescent diode according to an embodiment of the present disclosure.

Referring to FIG. 1B, in a cross sectional structure of the active region 101, a substrate 11 of the luminescent diode 100, an n-type passive waveguide 12 formed on the substrate 11, the n-type passive waveguide 12 being not etched, an n-type clad layer 13, an active layer 14, a p-type cap layer 15, a pnp current blocking layer 20 burying the active layer 14 while surrounding the active layer 14, an etch stop layer 31 and a ridge waveguide 40, which are formed over the pnp current blocking layer 20 and the p-type cap layer 15, a SiNx thin film 51 deposited over the ridge waveguide 40, and a p-type metal layer 52 and an n-type metal layer 61 respectively deposited on surface and bottom of the luminescent diode 100. Here, the active layer 14 may be etched to have a width of 10 to 20 μm in active region 101, In a cross sectional structure of the tapered region 102, the tapered region includes the substrate 11, and a passive waveguide core 12, the n-type clad layer 13, the active layer 14, and the p-type cap layer 15, which are sequentially stacked on the substrate 11. In this case, the n-type clad layer 13 on the passive waveguide core 12, the active layer 14 in the tapered region 102, and the p-type cap layer 15 may be etched to have a width decreased from 1 to 1.5 μm to 0 to 0.5 μm.

Subsequently, like the active region 101, the tapered region has a structure in which the pnp current blocking layer 20, the etch stop layer 31, the ridge waveguide 40, the SiNx thin film 51, the p-type metal layer 52, and the n-type metal layer 61 are sequentially stacked. Here, as the pnp current blocking layer 20 is formed, the tapered region 102 may have a planar buried heterostructure (PBH).

A first difference between the structures of the active region 101 and the tapered region 102 will be described. First, referring to FIG. 1A, the planar shapes of an active layer and a tapered active layer will be given as an example. The length direction of the active layer 14 in the tapered region 102 is formed to be inclined at an angle of 5 to 15 degrees with respect to that of the active layer 14 in the active region 101. In addition, the width of the active layer 14 in the tapered region 102 is formed to be narrower than that of the active layer 14 in the active region 101, and has a shape that the width of the active layer 14 in the tapered region 102 becomes narrower as it becomes more distant from the active region 101.

A second difference between the structures of the active region 101 and the tapered region 102 will be described. Referring to FIGS. 1A and 1B, the planar and sectional shapes of the ridge waveguide 40 will be given as an example. First, referring to FIG. 1A, as the ridge waveguide 40 is formed at a position overlapping the active layer 140 in the active region 101 and the active layer 14 in the tapered region 102, the ridge waveguide 40 in the tapered region 102 is formed to be inclined at a predetermined angle with respect to the ridge waveguide 40 in the active region 101. While the ridge waveguide 40 in the active region 101 may be formed into a reverse mesa structure in which the width of its section is narrowed as it comes close to its lower portion from its upper portion, and the ridge waveguide 40 in the tapered region 102 may be formed into a forward mesa structure in which the width of its section is the same from its upper portion to its lower portion. In addition, the width of the ridge waveguide 40 is formed to be narrower in the active region 101 than in the tapered region 102. The width of the ridge waveguide 40 in the active region 101 may be formed to be narrower than that of the active layer 14 in the active region 101. The width of the ridge waveguide 40 in the tapered region 102 may be formed to be wider than that of the active layer 14 in the tapered region 102.

In general, when the PBH is applied to the luminescent diode 100, the width of the active layer 14 in the active region 101 may be formed to be about 0.7 to 2 μm. When the width of the active layer 14 is wide, a difference in refractive index between the active layer 14 and the pnp current blocking layer 20 is increased, and hence the luminescent diode 100 may be operated in a multi-mode. In the embodiment of the present disclosure, the width of the active layer 14 is formed in a range of 10 to 20 μm. When the luminescent diode 100 is manufactured as described above, a far field pattern (FFP) characteristic may be shown in the multi-mode. Therefore, in order to reduce the characteristic, the ridge waveguide 40 having the reverse mesa structure is formed over the active layer 14. In this case, injected current is diffused into the active layer 14, and hence it is possible to remove the characteristic in which the luminescent diode 100 be operated in the multi-mode. Meanwhile, in the tapered region 102, the n-type passive waveguide core 12 is formed to have a width of about 3 to 9 μm under the active layer 14 in the tapered region 102, and the ridge waveguide 40 having the forward mesa structure is formed to have a width of about 11 μm, which covers the width of the active layer 14 in the tapered region 102. In this case, the FFP characteristic may be shown as 15 degrees or less, which is excellent.

Next, a method for manufacturing the luminescent diode 100 according to an embodiment of the present disclosure will be described in detail with reference to FIGS. 2 and 3A to 3H.

Figure 3A:
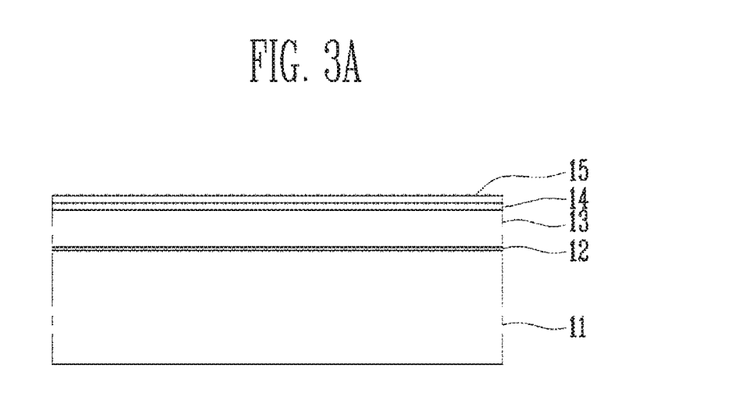
FIGS. 3A to 3H are plan views illustrating the method and sectional views in the active region (region I-I') and the tapered region (region II-II') of the luminescent diode according to the embodiment of the present disclosure.

First, an epitaxial layer is formed (S100). Referring to FIG. 3A, a substrate 11 is prepared, and an n-type passive waveguide 12, an n-type clad layer 13, an active layer 14, and a p-type cap layer 15 are sequentially stacked on the substrate 11, thereby forming the epitaxial layer. Here, the substrate 11 may be an N—InP substrate.

Subsequently, photolithography and etching processes are performed on the epitaxial layer, thereby forming an active layer 14 in an active region 101 and a tapered region 102 (S110).

Figure 3B:
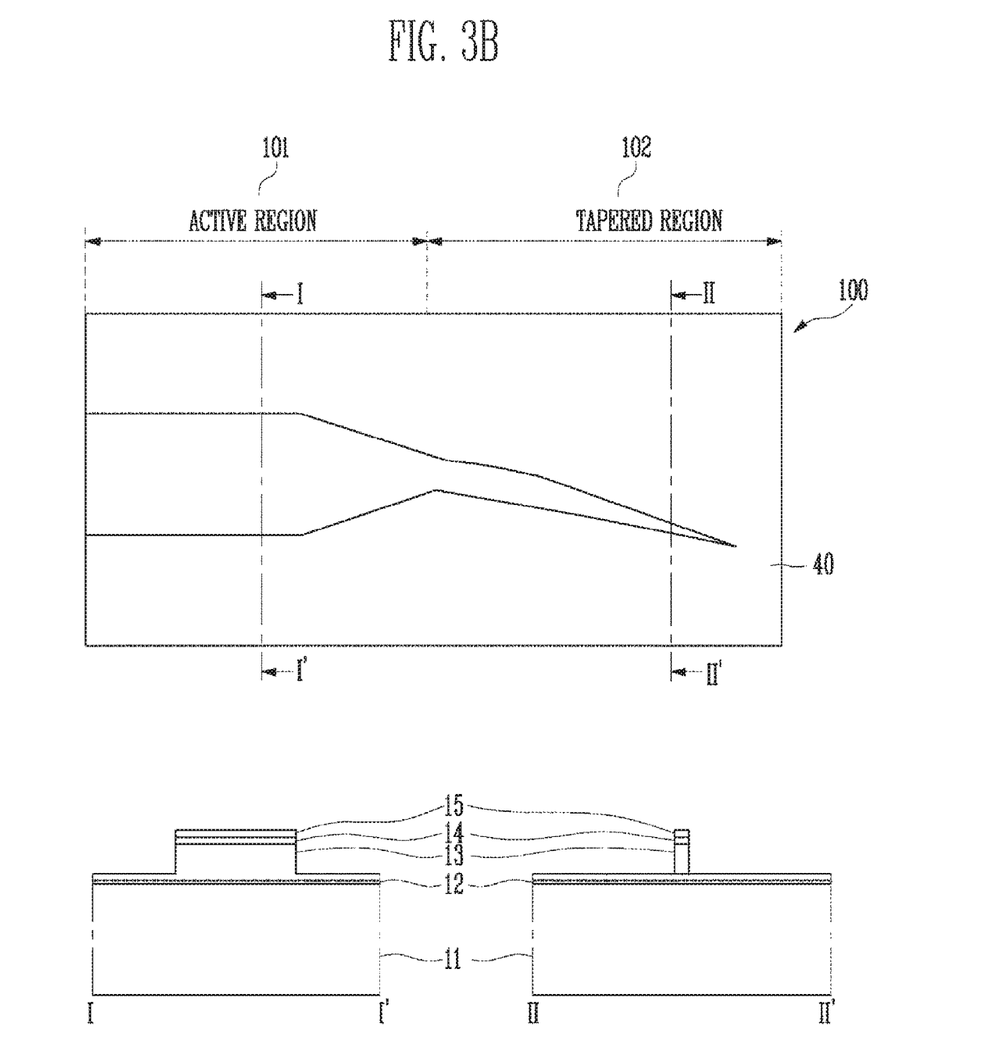

Referring to FIG. 3B, a photoresist defining the active layer 14 in the active region 101 and the active layer 14 in the tapered region 102 is formed at an upper portion of the epitaxial layer through a photolithography process, and portions of the n-type clad layer 13, the active layer 14, and the p-type cap layer 15 are removed through an etching (dry or wet) process, thereby forming the active layer 14 in the active region 101 and the active layer 14 in the tapered region 102. Referring to an upper drawing of FIG. 3B, the planar shape of the active layer 14 in the active region 101 has a horizontal length direction, and the planar shape of the active layer 14 in the tapered region 102 is curved at a predetermined angle with respect to the horizontal length direction. In addition, the active layer 14 in the tapered region 102 is formed to have a width narrower as it becomes more distant from the active region 101, thereby having a sharp end.

The active layer 14 in the active region 101 may be formed to have a width of 10 to 20 µm, and the active layer 14 in the tapered region 102 may be formed to have a width of 1 to 1.5 µm or 0 to 0.5 µm. In order to form the active layer 14 in the active region 101 and the active layer 14 in the tapered region 102, the n-type clad layer 13, the active layer 14, and the p-type cap layer 15 may be etched down to 150 to 250 nm (preferably, about 200 nm) from the top of the n-type passive waveguide 12.

Figure 3C:
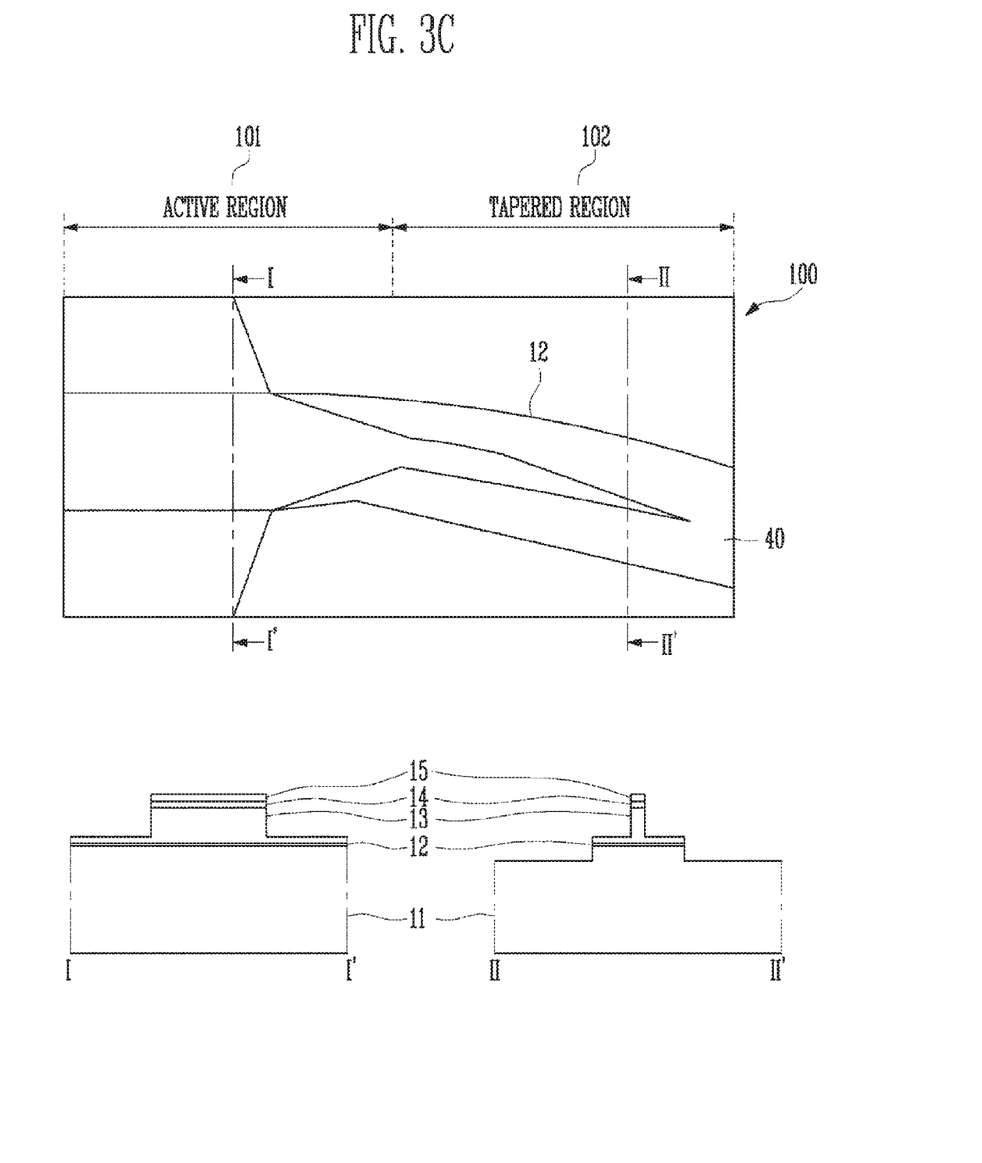

Subsequently, as shown in FIG. 3C, a passive waveguide core 12 is formed at an upper portion of the epitaxial layer. First, a photoresist is formed by performing a photolithography process at the upper portion of the epitaxial layer, and an etching (dry or wet) process is then performed on the n-type passive waveguide 12 and the n-type clad layer 13, thereby forming the passive waveguide core 12. Referring to an upper drawing of FIG. 3C, the passive waveguide core 12 is formed in the tapered region 102, and may be formed to overlap with the active layer 14 in the tapered region 102 while covering the width of the active layer 14 in the tapered region 102. Since the FFP characteristic is determined by the passive waveguide core 12, the passive waveguide core 12 may be formed to have a width of 9 µm or less.

Subsequently, a PBH is formed in the tapered region 102 (S120).

Figure 3D:
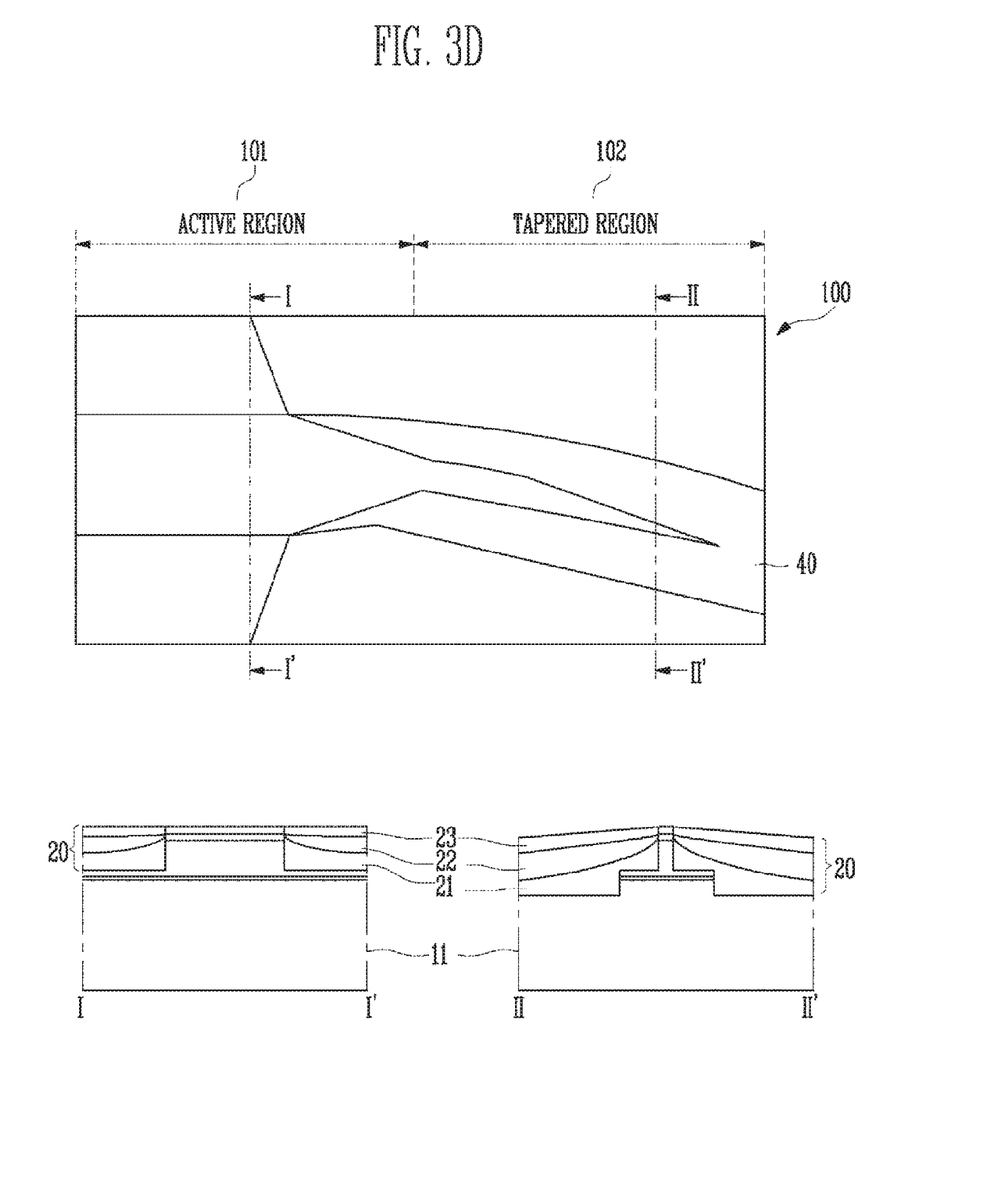

Referring to FIG. 3D, in order to form the PBH, a pnp current blocking layer 20 burying the active layer 14 in the active region 101 and the active layer 14 in the tapered region 102 is formed on a front facet of the epitaxial layer. Specifically, a P—InP current blocking layer 21, an N—InP current blocking layer 22, and a P—InP current blocking layer 23 are sequentially grown in the etched region of the epitaxial layer, thereby forming the pnp current blocking layer 20. The thickness of the pnp current blocking layer 20 may be grown not to be thicker than the thickness of the etched epitaxial layer. For example, if the total thickness of the etched epitaxial layer is 0.7 µm, the thickness of the pnp current blocking layer 20 may also be about 0.7 µm.

Referring to sectional views of regions I-I' and II-II' of FIG. 3D, while the top surface of the pnp current blocking layer 20 in the active region 101 is formed flat to be equal to the top surface of the active layer 14 in the active region 101, and the top surface of the pnp current blocking layer 20 in the tapered region 102 is formed to be downwardly inclined at a predetermined angle with respect to the top surface of the active layer 14 in the tapered region 102.

Then, a ridge waveguide 40 is formed over the active layer 14 in the active region 101 and the tapered region 102 (S130).

Figure 3E:
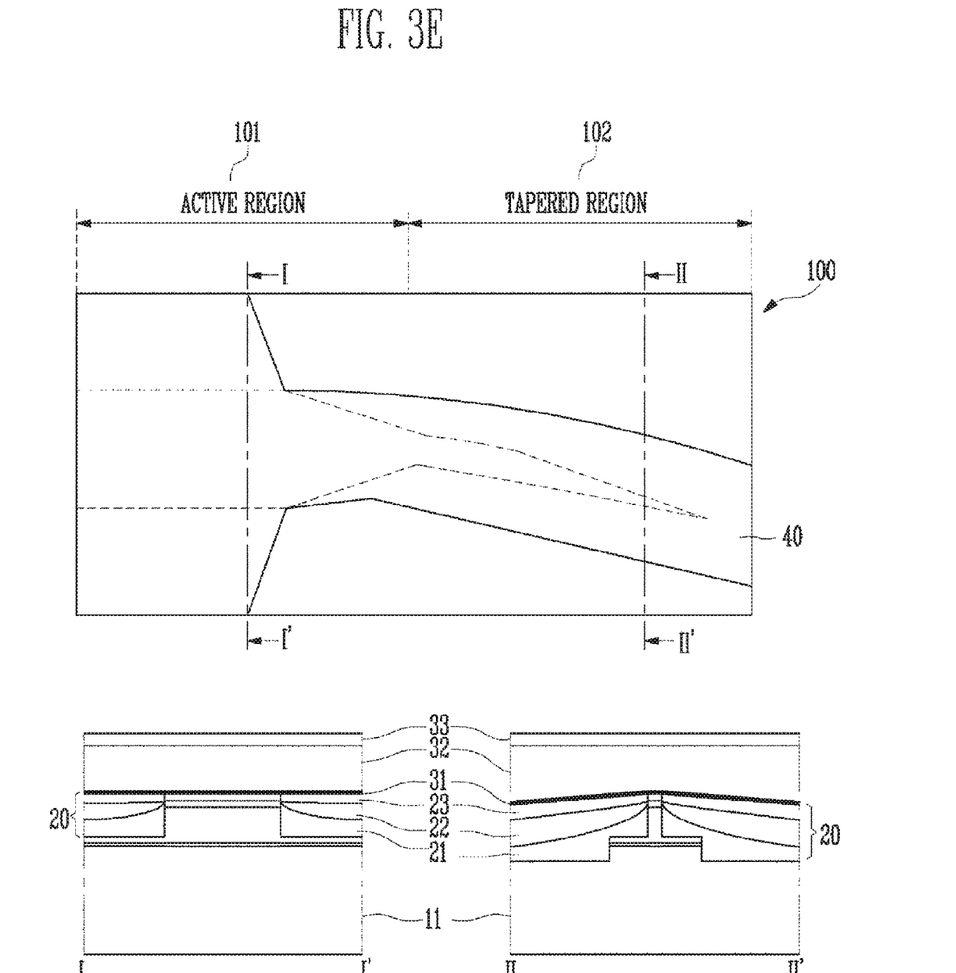

Specifically, referring to FIG. 3E, in order to form the ridge waveguide 40, an etch stop layer 31, a p-type clad layer 32, and a p-type ohmic layer 33 are sequentially stacked on the pnp current blocking layer 20.

Subsequently, referring to FIG. 3F, the p-type clad layer 32 and the p-type ohmic layer 33 are selectively etched, thereby forming the ridge waveguide 40 having a reverse mesa structure in the active region 101 and forming the ridge waveguide 40 having a forward mesa structure in the tapered region 102. The reverse mesa structure is a structure in which the width of the rigid waveguide 40 is narrowed as it comes close to its lower portion from its upper portion, and the width 43 (ohmic layer 33) of an upper surface of the ridge waveguide 40 may be 4.5 to 5 µm.

The forward mesa structure is a structure in which the width of the ridge waveguide 40 is the same from its upper portion to its lower portion, and the width 44 (ohmic layer 33) of an upper surface of the ridge waveguide 40 may be 5 to 11 µm.

Figure 3F:
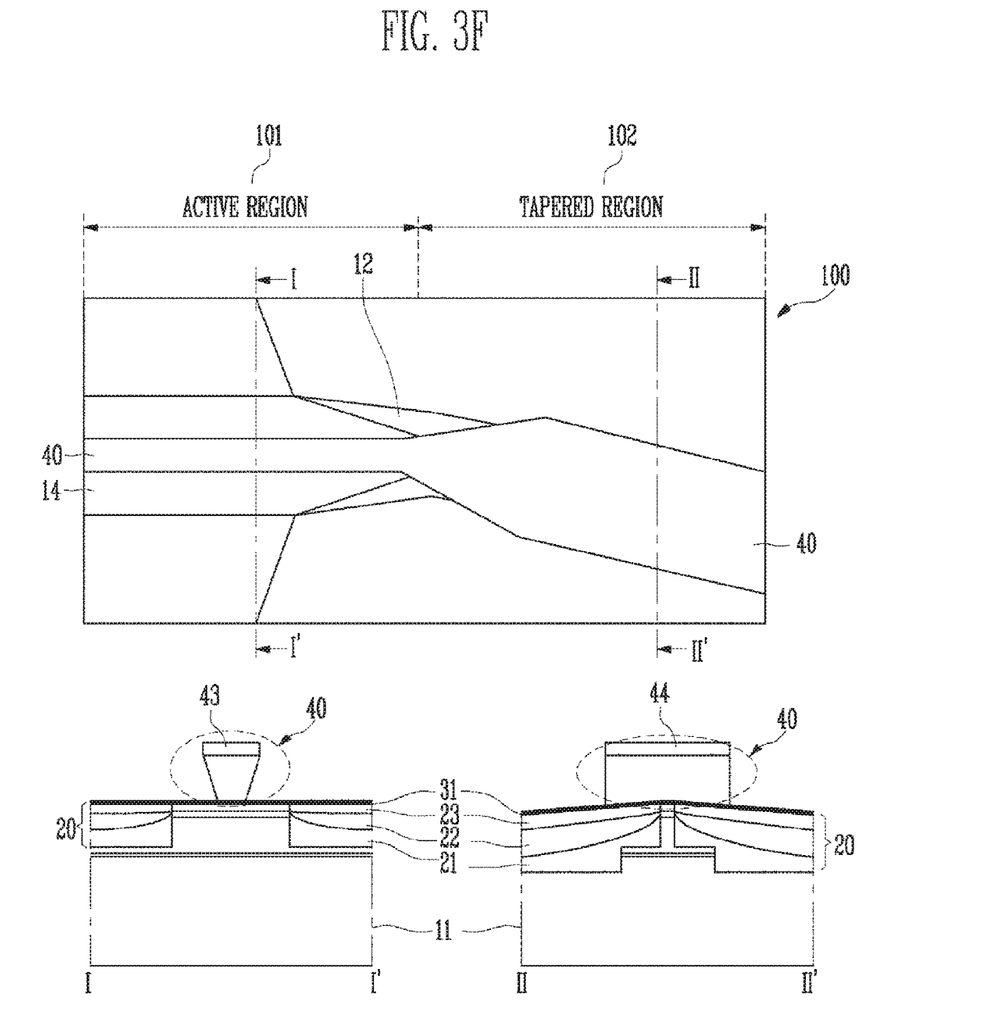

According to features of the structures, referring to an upper drawing of FIG. 3F, the ridge waveguide 40 in the active region 101 has a narrower width than the active layer 14 in the active region 101, and is disposed to overlap with the active layer 14 in the active region 101. On the other hand, the ridge waveguide 40 in the tapered region 102 has a wider width than the active layer 140 in the tapered region 102, and is disposed to overlap with the active layer 14 in the tapered region 102.

As a final process, a p-type metal layer 52 is deposited the upper region of the epitaxial layer, and an n-type metal layer 61 is deposited a bottom region of the substrate including the epitaxial layer.

Figure 3G:
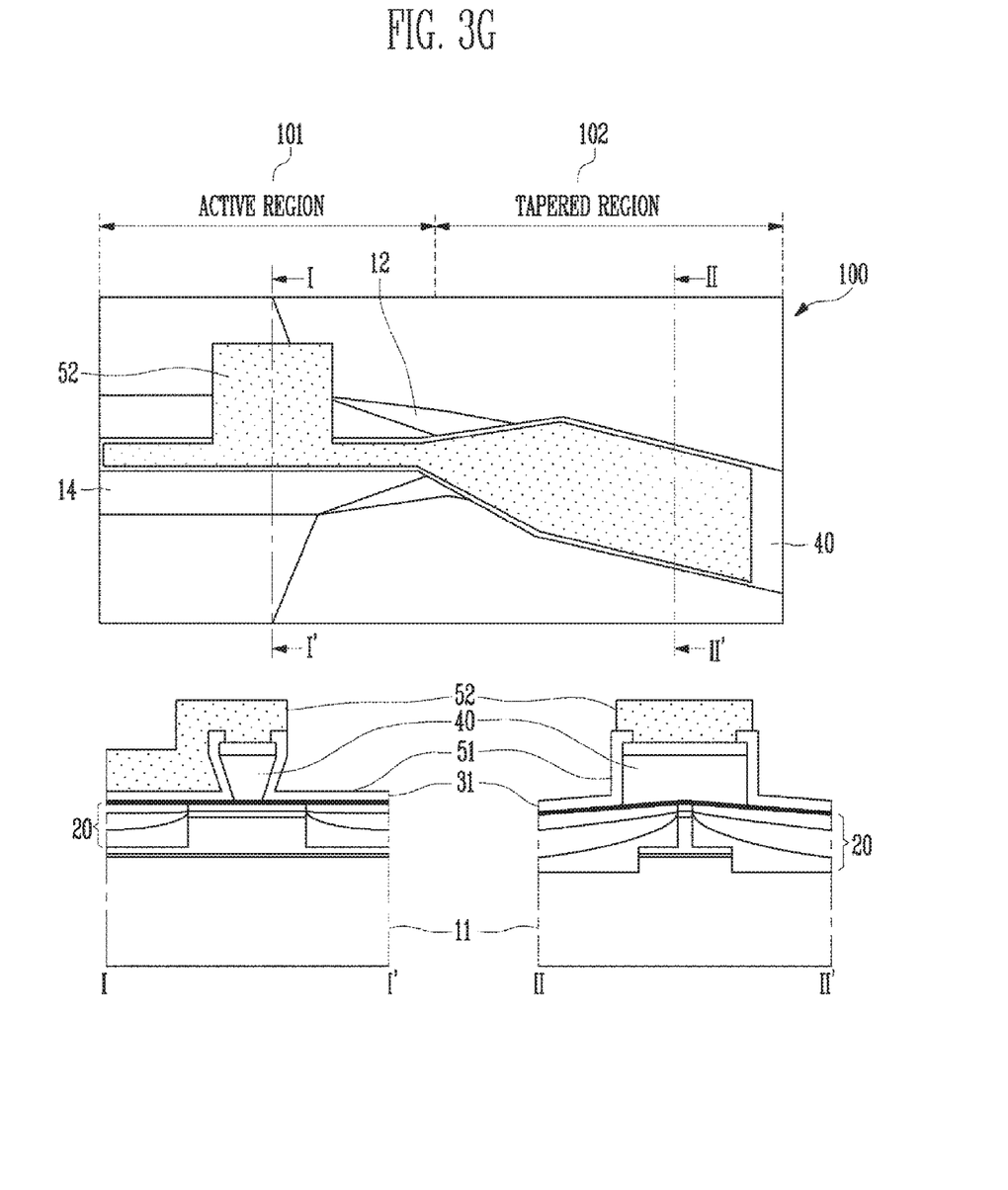

Specifically, referring to FIG. 3G, a SiNx or SiO2 thin film 51 is formed over the top surface of the epitaxial layer on which the ridge waveguide 40 is formed. In this case, the SiNx or SiO2 thin film 51 deposited on a top surface of the ridge waveguide 40 may be removed such that the top surface of the ridge waveguide 40 is exposed. Subsequently, the p-type metal layer 52 is formed on the ridge waveguide 40 to come in contact with the ohmic layer (33 or 43) of the ridge waveguide 40. The p-type metal layer 52 in the active region 101 may be formed to overlap with the top surface of the ridge waveguide 40 and a portion of the active layer 14, and the p-type metal layer 52 in the tapered region 102 may be formed on only the top surface of the ridge waveguide 40.

Figure 3H:
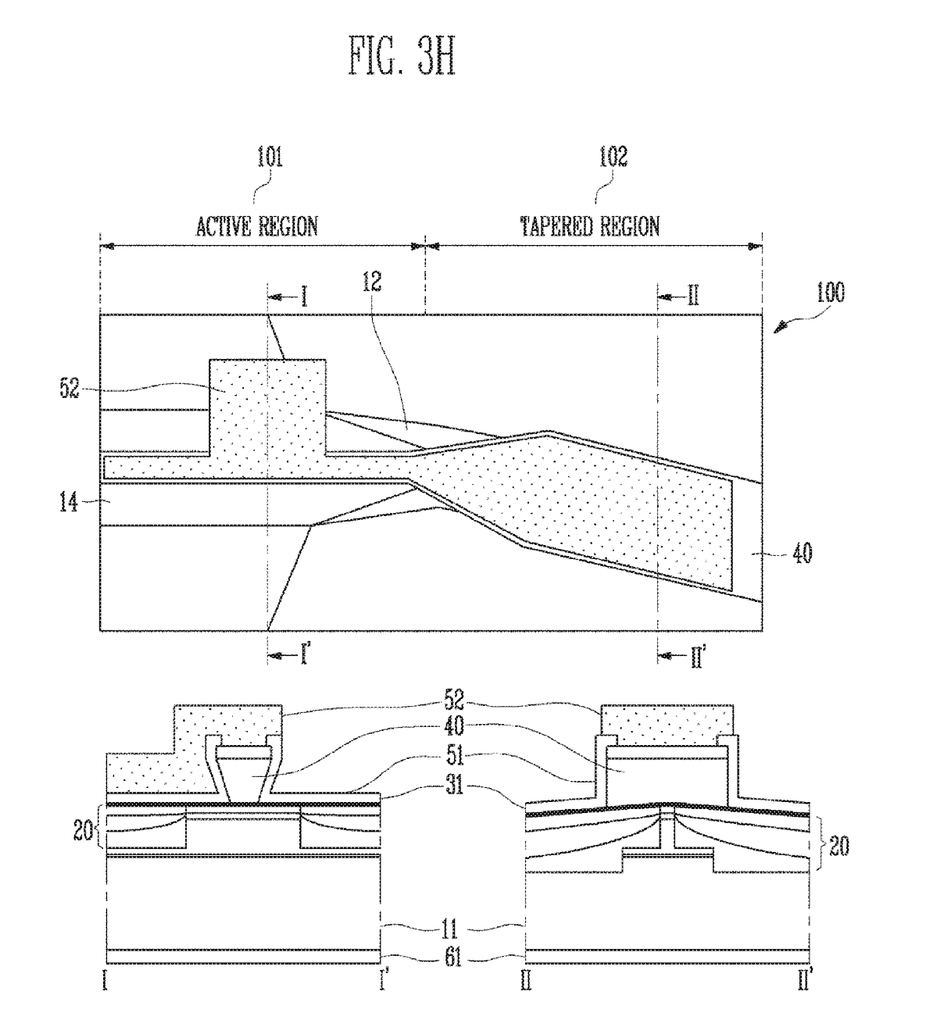

Referring to FIG. 3H, the epitaxial layer is lapped, and the n-type metal layer 61 is then deposited on the bottom region of the epitaxial layer, thereby completing the method for manufacturing the luminescent diode 100.

The luminescent diode 100 (preferably, the SLD) manufactured as described above can be used in a wavelength tunable external cavity laser. Hereinafter, a structure of a wavelength tunable external cavity laser according to an embodiment of the present disclosure will be described in detail with reference to FIGS. 4A and 4B.

Figure 4A:
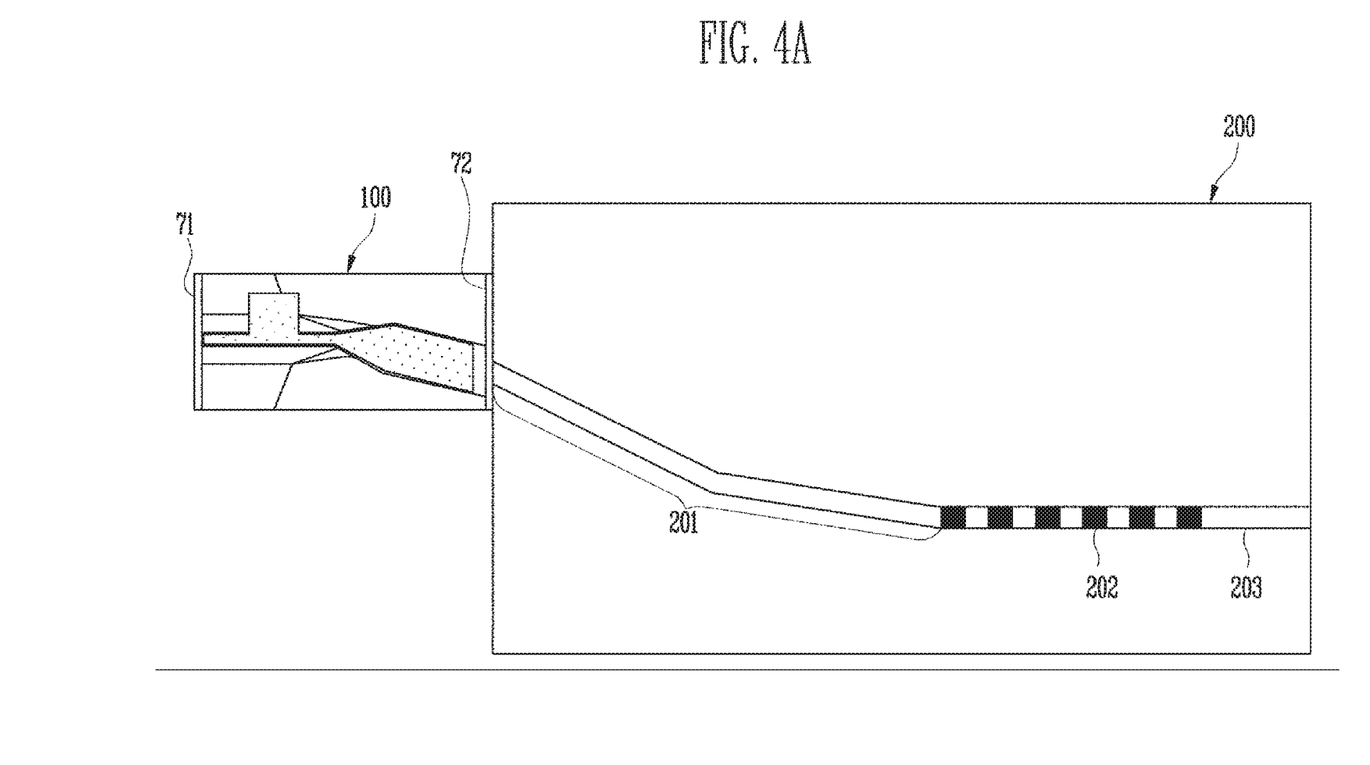
FIGS. 4A and 4B are structural views of a wavelength tunable external cavity laser using the luminescent diode according to an embodiment of the present disclosure.

First, referring to FIG. 4A, the wavelength tunable external cavity laser according to the embodiment of the present disclosure includes a luminescent diode 100 and a reflector 200 that generates a laser beam by oscillating light from the luminescent diode 100. In this case, the reflector 200 may be configured as a Bragg reflector 200.

The luminescent diode 100 is a luminescent diode having a structure in which the PBH structure and the structure of the ridge waveguide 40 are combined. The luminescent diode 100 further includes a reflective coating part 71 and a non-reflective coating part 72. When a facet at which an end of the active layer 14 in the tapered region 102 of the luminescent diode 100 is disposed is defined as an 'output stage,' and a facet at which an end of the active layer 14 in the tapered region 102 of the luminescent diode 100 is disposed, the facet being disposed opposite to the output stage is defined as an 'input stage,' the non-reflective coating part 72 may be attached to the output stage of the luminescent diode 100, and the reflective coating part 71 may be attached to the input stage of the luminescent diode 100.

When current is injected into the luminescent diode 100, light is generated in the active layer 14. The light is highly reflected by the reflective coating part 71, to be emitted to the output stage of the luminescent diode 100 via the active layer 14 in the tapered region 102. That is, the reflective coating part 71 and the non-reflective coating part 72 are components attached such that the luminescent diode 100 emits light in only one direction.

The reflector 200 may include a first optical waveguide 201 that receives the light emitted from the output stage of the luminescent diode 100, a second optical waveguide 202 that oscillates the light transmitted from the first optical waveguide 201, and a third optical waveguide 203 that emits, to the outside, the light oscillated by the second optical waveguide 202. In this case, the reflector 200 may be disposed adjacent to the output stage of the luminescent diode 100 such that the entrance of the first optical waveguide 201 corresponds to the end of the active layer 14 in the tapered region 102. Thus, the reflector 200 can receive light generated from the luminescent diode 100.

Meanwhile, the first optical waveguide 201 may be formed to be inclined at an angle of 15 to 40 degrees with respect to a surface of the reflector 200. The active layer 14 in the tapered region 102 of the luminescent diode 100 becomes a path through which light is emitted. The active layer 14 in the tapered region 102 of the luminescent diode 100 is formed to be inclined at a predetermined angle (e.g., an angle of about 5 to 15 degrees with respect to the length direction of the active layer 14 of the active region 101) such that the light emitted from the luminescent diode 100 is hardly reflected on an interface of the luminescent diode 100. Corresponding to this, the first optical waveguide 201 is also formed to be inclined with respect to the surface of the reflector 200, adjacent to the output stage of the luminescent diode 100.

The second optical waveguide 202 may be configured as a Bragg waveguide. The second optical waveguide 202 allows a wavelength corresponding to the reflection period thereof among wavelengths included in the light transmitted thereto to return to the active layer 14 of the luminescent diode 100. When a certain gain or more is obtained as such a phenomenon is repeated, oscillation is generated. The oscillated wavelength is transmitted to the outside of the reflector 200 through the third optical waveguide 203. That is, the reflective coating part 71 of the luminescent diode 100 and the second optical waveguide 202 of the reflector 200 form a cavity chamber, thereby forming an external cavity laser.

Figure 4B:
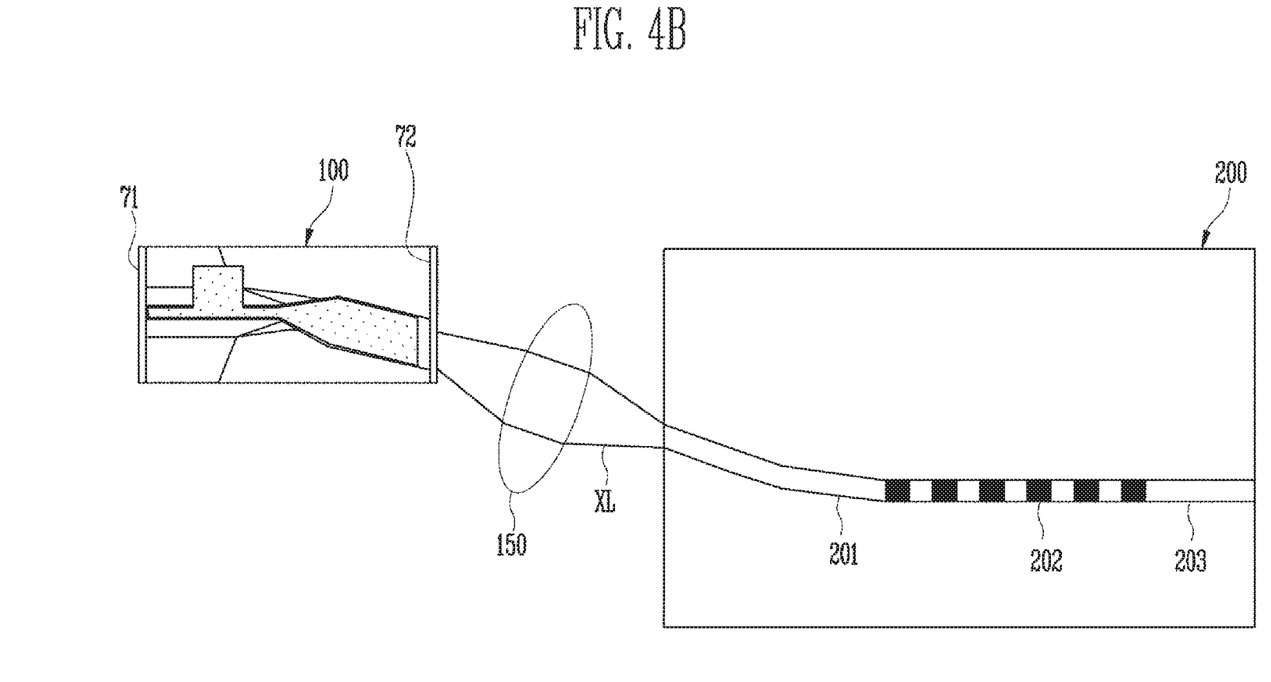

Meanwhile, referring to FIG. 4B, the wavelength tunable external cavity laser may further include a lens 150 so as to improve the coupling efficiency between the luminescent diode 100 and the reflector 200. The lens 150 may be configured as a convex lens. The lens 150 is disposed between the output stage of the luminescent diode 100 and the reflector 200, to further focus light XL emitted from the output stage of the luminescent diode 100 onto the reflector 200.

A light output and an FFP are shown as a circle of 15 degrees or less so as to improve the coupling efficiency of the luminescent diode 100 with an external passive device, etc. From this viewpoint, the luminescent diode 100 according to the embodiment of the present disclosure is provided with a spot size converter (SSC) at the output stage, and the SSC has a structure tilted at an angle of 5 to 15 degrees so as to prevent oscillation of the luminescent diode 100 (i.e., the formation of the active layer 14 in the tapered region 102). Meanwhile, when the ridge waveguide 40 is formed over the active layer 14 in the tapered region 102 and the active layer 14 in the active region 101 so as to manufacture the luminescent diode 100 having high-output characteristics, the ridge waveguide 40 has a tilted structure, and therefore, electro-optic loss is increased. In order to prevent such a problem, in the luminescent diode 100 according to the embodiment of the present disclosure, the PBH is formed in the tilted tapered region 102 (i.e., the formation of the pnp current blocking layer 20 in the tapered region 102).

Consequently, in the luminescent diode 100 and the wavelength tunable external cavity laser using the same according to the present disclosure, the PBH and the structure of the ridge waveguide 40 are combined in the luminescent diode 100, so that the luminescent diode 100 can be operated to generate a high output of 100 mW or more at low current. Further, it is possible to reduce electro-optic loss.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A method for manufacturing a luminescent diode having an active region and a tapered region, the method comprising:
   forming an epitaxial layer by sequentially stacking, on a substrate, an n-type passive waveguide, an n-type clad layer, an active layer, and a p-type cap layer;
   etching a portion of the active layer disposed in the active region within the epitaxial layer, and forming a tapered active layer having a tapered shape along the length direction of the active layer disposed in the tapered region, the tapered active layer extending from the active layer;
   forming a planar buried heterostructure (PBH) by forming a pnp current blocking layer burying a tapered layer in the tapered region; and
   forming a ridge waveguide on the active layer in the active region and the tapered region, wherein
   the ridge waveguide has a reverse mesa structure with a width less than a width of the active layer in the active region.

2. The method of claim 1, wherein the forming of the tapered active layer includes forming the width of the tapered layer to become narrower as it becomes more distant from the active region.

3. The method of claim 1, wherein the forming of the tapered active layer includes etching the n-type passive waveguide in a region except the active region.

4. The method of claim 1, wherein the forming of the PBH includes:
   forming a passive waveguide core by etching the n-type passive waveguide under the tapered layer in the tapered region, wherein the passive waveguide core covers the width of the tapered layer and overlaps with the tapered layer; and
   forming the pnp current blocking layer burying the active layer and the tapered layer in the active region and the tapered region.

5. The method of claim 4, wherein the forming of the pnp current blocking layer includes forming a top surface of the pnp current block layer in the active region to be flat with respect to that of the active layer, wherein a top surface of the pnp current blocking layer in the tapered region is formed to be inclined at a predetermined angle with respect to that of the tapered surface.

6. The method of claim 1, wherein the forming of the ridge waveguide includes:
sequentially stacking an etch stop layer, a p-type clad layer, and a p-type ohmic layer over a top surface of the epitaxial layer on which the pnp current blocking layer is formed;
forming the ridge waveguide overlapping with the active layer and the tapered layer by selectively etching the p-type clad layer and the p-type ohmic layer; and
forming a p-type metal layer over the ridge waveguide and forming an n-type metal layer under the substrate including the epitaxial layer.

7. The method of claim 6, wherein the forming of the ridge waveguide overlapping with the active layer and the tapered layer by selectively etching the p-type clad layer and the p-type ohmic layer includes forming the ridge waveguide in the active region to have the reverse mesa structure in which the width of its section is narrowed as it comes close to its lower portion from its upper portion, and forming the ridge waveguide in the tapered region to have a forward mesa structure in which the width of its section is the same from its upper portion to its lower portion.

8. The method of claim 7, wherein the forming of the ridge waveguide overlapping with the active layer and the tapered layer by selectively etching the p-type clad layer and the p-type ohmic layer includes forming the ridge waveguide such that the width of ridge waveguide in the active region is narrower than that of the ridge waveguide in the tapered region, the width of ridge waveguide is narrower than that of the active layer in the active region, and the width of ridge waveguide is wider than that of the tapered layer in the tapered region.

9. A luminescent diode having an active region and a tapered region, the luminescent diode comprising:
a substrate;
an active layer formed to have a predetermined width and a predetermined length in the active region on the substrate;
a tapered layer having a tapered shape along the length direction of the active layer disposed in the tapered region on the substrate, the tapered layer being formed of the same material as the active layer to extend from the active layer;
a pnp current blocking layer formed over the substrate, the pnp current blocking layer forming a PBH by burying the tapered layer; and
a ridge waveguide formed on the active layer, the tapered layer, and the pnp current blocking layer, the ridge waveguide being formed to overlap with the active layer and the tapered layer, wherein
the ridge waveguide has a reverse mesa structure with a width less than a width of the active layer in the active region.

10. The luminescent diode of claim 9, wherein the tapered layer is formed to be inclined at an angle of 5 to 15 degrees with respect to the length direction of the active layer.

11. The luminescent diode of claim 9, wherein the tapered layer is formed to become narrower as it becomes more distant from the active region.

12. The luminescent diode of claim 9, further comprising a passive waveguide core formed between the tapered layer and the substrate, the passive waveguide core overlapping with the tapered layer while covering the width of the tapered layer.

13. The luminescent diode of claim 9, wherein the pnp current blocking layer is formed to burry not only the tapered layer but also the active layer, and is formed to be flat with respect to a top surface of the active layer in the active region,
wherein the pnp current blocking layer is formed to be inclined at a predetermined angle with respect to a top surface of the tapered layer in the tapered region.

14. The luminescent diode of claim 9, wherein the ridge waveguide is formed in the active region to have the reverse mesa structure in which the width of its section is narrowed as it comes close to its lower portion from its upper portion, and is formed in the tapered region to have a forward mesa structure in which the width of its section is the same from its upper portion to its lower portion.

15. The luminescent diode of claim 14, wherein the ridge waveguide is formed such that the width of ridge waveguide in the active region is narrower than that of the ridge waveguide in the tapered region, the width of ridge waveguide is narrower than that of the active layer in the active region, and the width of ridge waveguide is wider than that of the tapered layer in the tapered region.

16. The luminescent diode of claim 9, wherein the luminescent diode is a superluminescent diode (SLD).

17. A wavelength tunable external cavity laser comprising:
a luminescent diode; and
a reflector disposed adjacent to an output stage of the luminescent diode, at which an end of the tapered layer is disposed, to generate a laser beam by oscillating light emitted from the output stage of the luminescent diode,
wherein the luminescent comprises:
a substrate;
an active layer formed to have a predetermined width and a predetermined length in the active region on the substrate;
a tapered layer having a tapered shape along the length direction of the active layer disposed in the tapered region on the substrate, the tapered active layer formed of the same material as the active layer to extend from the active layer;
a pnp current blocking layer formed over the substrate, the pnp current blocking layer forming a PBH by burying the tapered layer; and
a ridge waveguide formed on the active layer, the tapered layer, and the pnp current blocking layer, the ridge waveguide being formed to overlap with the active layer and the tapered layer,
wherein the reflector includes a first optical waveguide that receives the light emitted from the output stage of the luminescent diode, a second optical waveguide that oscillates the light transmitted from the first optical waveguide, and a third optical waveguide that emits, to the outside, the light oscillated by the second optical waveguide,
wherein the ridge waveguide has a reverse mesa structure with a width less than a width of the active layer in the active region.

18. The wavelength tunable external cavity laser of claim 17, further comprising a reflective coating part disposed at an input stage of the luminescent diode, at which an end of the active layer of the luminescent diode is disposed, to reflect light generated from the active layer to be emitted to the output stage of the luminescent diode.

19. The wavelength tunable external cavity laser of claim 18, wherein the first optical waveguide of the reflector is formed to be inclined at an angle of 15 to 40 degrees with respect to a surface of the reflector, disposed adjacent to the output stage of the luminescent diode, to correspond to the emission direction of the light emitted from the output stage of the luminescent diode.

20. The wavelength tunable external cavity laser of claim 17, further comprising a lens disposed between the output stage of the luminescent diode and the reflector to improve the coupling efficiency between the luminescent diode and the reflector.

\* \* \* \* \*